United States Patent [19]
Griffiths

[11] Patent Number: 5,956,724
[45] Date of Patent: *Sep. 21, 1999

[54] METHOD FOR COMPRESSING A DATA FILE USING A SEPARATE DICTIONARY FILE

[75] Inventor: Laurence Kelvin Griffiths, Southhampton, United Kingdom

[73] Assignee: Microsoft Corporation

[*] Notice: This patent is subject to a terminal disclaimer.

[21] Appl. No.: 08/881,919

[22] Filed: Jun. 25, 1997

Related U.S. Application Data

[63] Continuation of application No. 08/547,818, Oct. 25, 1995.

[51] Int. Cl.[6] .................................................. G06F 17/30
[52] U.S. Cl. ........................................... 707/101; 707/6
[58] Field of Search ................................. 341/51, 50, 79; 707/102, 6, 101

[56] References Cited

U.S. PATENT DOCUMENTS

| | | | |
|---|---|---|---|
| 3,675,211 | 7/1972 | Raviv | 341/67 |
| 3,883,847 | 5/1975 | Frank | 711/206 |
| 4,099,257 | 7/1978 | Arnold et al. | 341/67 |
| 4,464,650 | 8/1984 | Eastman et al. | 341/51 |
| 4,558,302 | 12/1985 | Welch | 341/51 |
| 4,626,829 | 12/1986 | Hauck | 341/63 |
| 4,814,746 | 3/1989 | Miller et al. | 341/95 |
| 4,988,998 | 1/1991 | O'Brien | 341/55 |
| 5,253,325 | 10/1993 | Clark | 704/200 |
| 5,280,600 | 1/1994 | Van Maren et al. | 360/48 |
| 5,333,313 | 7/1994 | Heising | 707/1 |
| 5,410,671 | 4/1995 | Elgamal et al. | 2/195.1 |
| 5,426,779 | 6/1995 | Chambers, IV | 707/6 |
| 5,455,576 | 10/1995 | Clark, II et al. | 341/50 |
| 5,534,861 | 7/1996 | Chang et al. | 341/79 |
| 5,537,551 | 7/1996 | Denenberg et al. | 395/200.77 |
| 5,546,575 | 8/1996 | Potter et al. | 707/101 |
| 5,592,667 | 1/1997 | Bugajski | 707/102 |
| 5,629,695 | 5/1997 | Watts et al. | 341/51 |
| 5,635,931 | 6/1997 | Franazek et al. | 341/51 |
| 5,686,912 | 11/1997 | Clark et al. | 341/51 |

*Primary Examiner*—Thomas G. Black
*Assistant Examiner*—Charles L. Rones
*Attorney, Agent, or Firm*—Jones & Askew, LLP

[57] ABSTRACT

A system for compressing a first file based on a second file used as a dictionary. The second file is sampled at predetermined locations within the second file, each sample having a fixed sample length. A dictionary database is created by storing each sample and a start position within the second file of the corresponding sample. The first file is compared to the dictionary database to locate any matches that exist between the first file and the stored samples of the dictionary database. In turn, the first file is encoded by outputting coded segments for each match located by this comparison of the source file and the dictionary database and uncoded segments for all remaining portions of the first file.

13 Claims, 6 Drawing Sheets

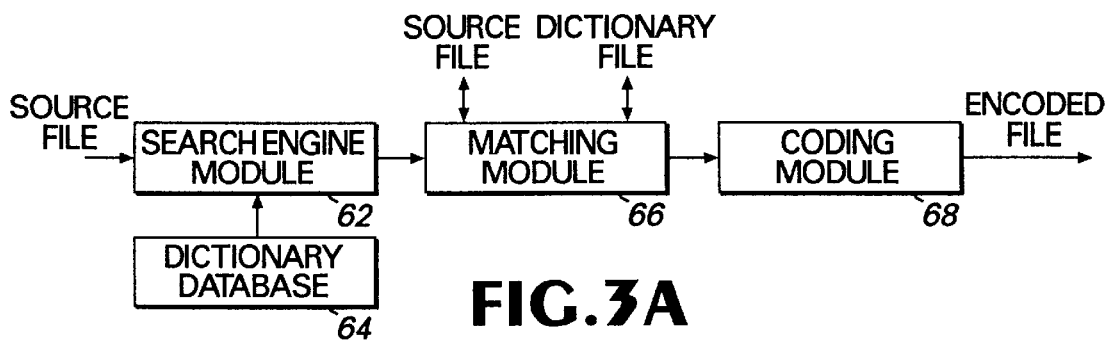
FIG. 3A
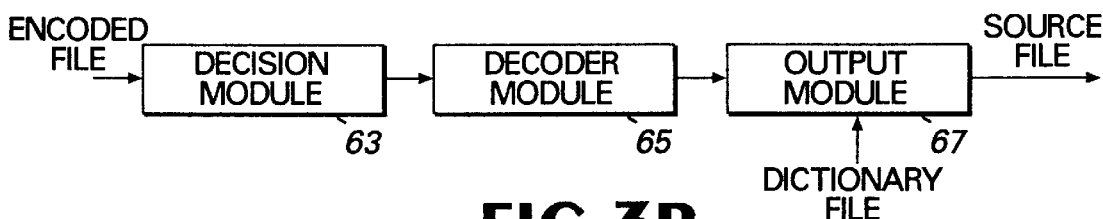
FIG. 3B
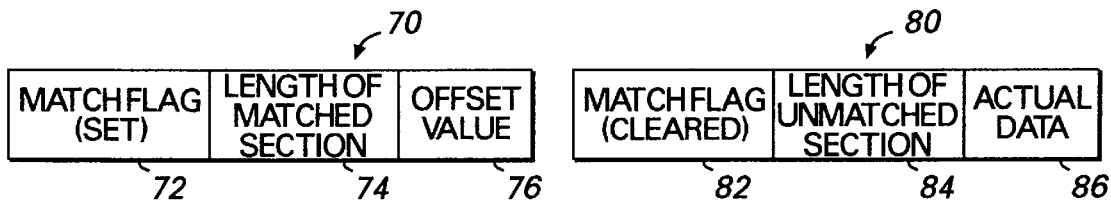
FIG. 4A  FIG. 4B
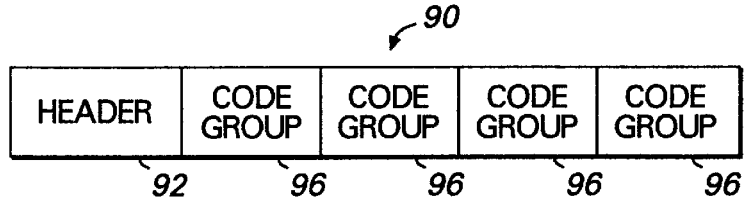
FIG. 5A
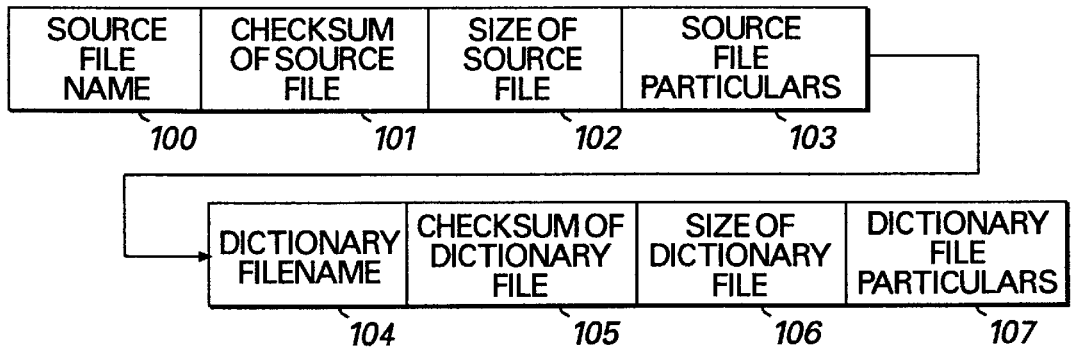
FIG. 5B

METHOD FOR COMPRESSING A DATA FILE USING A SEPARATE DICTIONARY FILE

This is a continuation of application Ser. No. 08/547,818 entitled "APPARATUS AND METHOD FOR COMPRESSING A DATA FILE BASED ON A DICTIONARY FILE", filed Oct. 25, 1995, on behalf of inventor Laurence Kelvin Griffiths, and assigned to Microsoft Corporation.

FIELD OF THE INVENTION

This present invention is generally directed to data compression systems and, more particularly, relates to a system for efficiently reducing the size of a data file based on a dictionary file for transmission by or storage on a data processing system.

BACKGROUND OF THE INVENTION

In the field of data processing systems, it is desirable to reduce the size of data files to conserve memory and to efficiently use available transmission bandwidth. This objective can be achieved by the use of a data compression system. Data compression generally refers to any technique for converting data in a given format into an alternative format having fewer characters or symbols than the original format. Data compression systems can encode a stream of data signals into compressed data signals and decode the compressed data signals to obtain the original stream of data signals.

A. Lempel and J. Ziv have described a method of compressing data (hereinafter the "L-Z" compression technique") based on a dictionary of character sequences that have already been encountered in an input data stream. When a sequence of characters is being compressed and that character sequence has already been encountered and stored in the dictionary, a compressor causes a reference value or token to be output to a coded file. The reference value identifies the string in the dictionary that is identical to the sequence of characters being compressed. In general, the number of bits required to identify the dictionary entry representing this sequence of characters is smaller than the number of bits that would have been required in the event that the entire character string had been output to the encoded file. In this manner, data is compressed by replacing sequences of characters with a reference value that identifies an entry in a dictionary. References for the L-Z compression technique include J. Ziv and A. Lempel, "A Universal Algorithm for Sequential Data Compression", *IEEE Transactions on Information Theory*, IT-23, 3, pages 337–343 (May 1977) and J. Ziv and A. Lempel, "Compression of Individual Sequences via Variable-Rate Coding", *IEEE Transactions on Information Theory*, IT-24, 5, pages 530–537 (September 1977).

U.S. Pat. No. 4,464,650 to Eastman et al. describes an adaptive data compression system that parses the stream of input data symbols into segments, each segment comprising a prefix and the next data signal occurring in the input data stream following the prefix. The prefix comprises the longest match with a previous segment. A pointer signal is generated for each segment, the pointer signal pointing to the previous segment matching the prefix. The pointer signals generated for the respective segments of the input data stream form the compressed stream of digital code signals.

U.S. Pat. No. 4,558,302 to Welch describes a data compression technique that (1) stores strings of characters parsed from the input data stream and (2) searches the input data stream by comparing the stream to the stored strings to determine the longest match of a stored string. Each stored string comprises a prefix string and an extension character. The extension character is the last character in the stored string and the prefix string comprises all but the extension character. Each stored string has a corresponding code signal. When the longest match between the input data character stream and the stored strings is determined, the code signal for the longest match is transmitted as the compressed code signal for the encountered string of characters, and an extended string is stored in the string table. The prefix of the extended string is the longest match, and the extension character of the extended string is the next input data character following the longest match.

A characteristic of the above-described data compression techniques is that they operate on the input data stream of the data file to be compressed. These data compression techniques use a previously encountered portion of the file to be compressed to achieve data compression. However, for certain applications, the data file to be compressed, i.e., the source file, is a revised version of an original data file. In view of the revised nature of the source file, it will be appreciated that the source file typically contains segments of characters that are identical to segments in the original file. A high level of compression can be achieved by taking advantage of this natural characteristic of redundant characters in revised and original data files.

In view of the foregoing, there is a need for a data compression system that uses the original data file as a dictionary to support the encoding of a revised version of this original data file. There is also a need for a data compression system that achieves a high level of compression based on the natural redundancy that occurs between the characters of an original data file and the revised version of this original data file.

SUMMARY OF THE INVENTION

The present invention satisfies the above-described needs by using a second file as a dictionary to support the compression of segments of characters in a first file based on matches between identical character segments in these files. The high level of data compression achieved by the present invention relies upon the redundant nature of the dictionary and source files.

Generally described, the present invention provides a system for compressing a first file, also described as a source file, based on the use of a second file as a dictionary or index. The dictionary file is sampled at predetermined locations within the dictionary file, each sample having a fixed sample length. A dictionary database is created by storing each sample and a start position within the dictionary file of the corresponding sample. The source file is compared to the dictionary database to locate any matches that exist between the source file and the stored samples of the dictionary database. In turn, the source file is encoded by outputting coded segments for each match located by this comparison of the source file and the dictionary database and uncoded segments for all remaining portions of the source file.

More particularly described, a dictionary database, also described as an index, is constructed by sampling a dictionary file at predetermined intervals, each sample typically having a fixed sample length. The dictionary database maintains (1) the samples and (2) the position of each sample within the dictionary file, i.e., an offset value. To achieve the advantage of rapid searching, this database can be constructed as a binary search tree.

Next, the file to be compressed, i.e., the source file, is obtained and scanned for matches against the dictionary database. An inquiry is conducted to determine whether a segment of the source file matches any of the samples stored within the dictionary database. The length of this segment is generally set to the fixed sample length. If the response to the inquiry is negative, then the "search" position within the source file is advanced by one character and the inquiry is repeated. Each character of the source file is eventually examined by the inventive compression technique.

If a match of the source file segment is located in the dictionary database, then, starting at the position within the dictionary file for the match, the pair of dictionary and source files are examined to locate a character match, typically the longest contiguous match, between these files. In turn, the matched segment of the source file is encoded by creating a matched code. The matched code can include a match flag, the length of the matching segment, and the start position of the match in the dictionary file. The match flag designates this code group as a matched code.

Any characters of the source file positioned before the matched segment and not previously supplied to an encoded output file are encoded by creating an unmatched code. The unmatched code can include a "cleared" match flag, the length of this unmatched portion of the source file, and the actual characters for this unmatched segment. A matched code is distinguished from the unmatched code by examining the state of the match flag.

To create the desired encoded file, the matched and unmatched codes are output to an output file. i.e.. an encoded file. The compression process then continues by advancing in the source file to the character located after the matched segment and looking for a match at this new position. In the event that this search for the next character in the source file locates the end of the file, then the compression of the source file is completed. A stop code is output to indicate the end of the encoded file.

The encoded file generated by the data compression system can be further compressed by conducting one or more additional compression "passes". For example, a conventional compression technique, such as the L-Z compression technique, can be applied to the encoded file produced during the first compression pass.

For another aspect of the present invention, a system is provided for decoding an encoded file with a dictionary file to generate a decoded file, i.e., the source file. The encoded file typically includes a sequence code groups, such as matched codes and unmatched codes. Each matched code has (1) a length of a matched segment and (2) a location in the dictionary file of the start of the matched segment. The matched segment represents the longest contiguous match between characters of the source file and the dictionary file. Each unmatched code has (1) a length of an unmatched segment and (2) characters of the unmatched segment. The unmatched segment represents characters of the source file located between the matched segment and a prior matched segment.

In response to receiving the encoded file, a selected code is examined to determine whether the code is an unmatched code or a matched code. In the event that the selected code is a matched code, then the length of the matched segment and the location in the dictionary file of the matched segment are obtained from the matched code. In response to the matched segment length and to the matched segment location, characters in the dictionary file corresponding to the matched segment are output to a decoded file.

In the event that the selected code is an unmatched code, then the unmatched segment length and the characters of the unmatched segment are obtained from the unmatched code. Characters of the source file corresponding to the characters of the unmatched segment are then output to the decoded file.

It is therefore an object of the present invention to provide an improved data compression system for compressing a data file by use of a dictionary file.

It is a further object of the present invention to provide a data compression system for compressing a data file by using another file containing characters similar to those in the data file.

It is a further object of the present invention to provide a data compression system for compressing a revised version of an original file by using the original file as a dictionary.

These and other objects, features, and advantages of the present invention may be more clearly understood and appreciated from a review of the following detailed description of the disclosed embodiments and by reference to the appended drawings and claims.

BRIEF DESCRIPTION OF THE DRAWINGS

FIGS. 3A and 3B, collectively described as FIG. 3, are diagrams respectively illustrating the principal components of an encoder and a decoder.

FIGS. 4A and 4B, collectively described as FIG. 4, are diagrams illustrating the formats for the codes generated by the preferred embodiment of the present invention.

FIGS. 5A and 5B, collectively described as FIG. 5, are diagrams illustrating the format of the encoded file generated by the preferred embodiment of the present invention.

DETAILED DESCRIPTION OF THE PREFERRED EMBODIMENT

Figure 1:
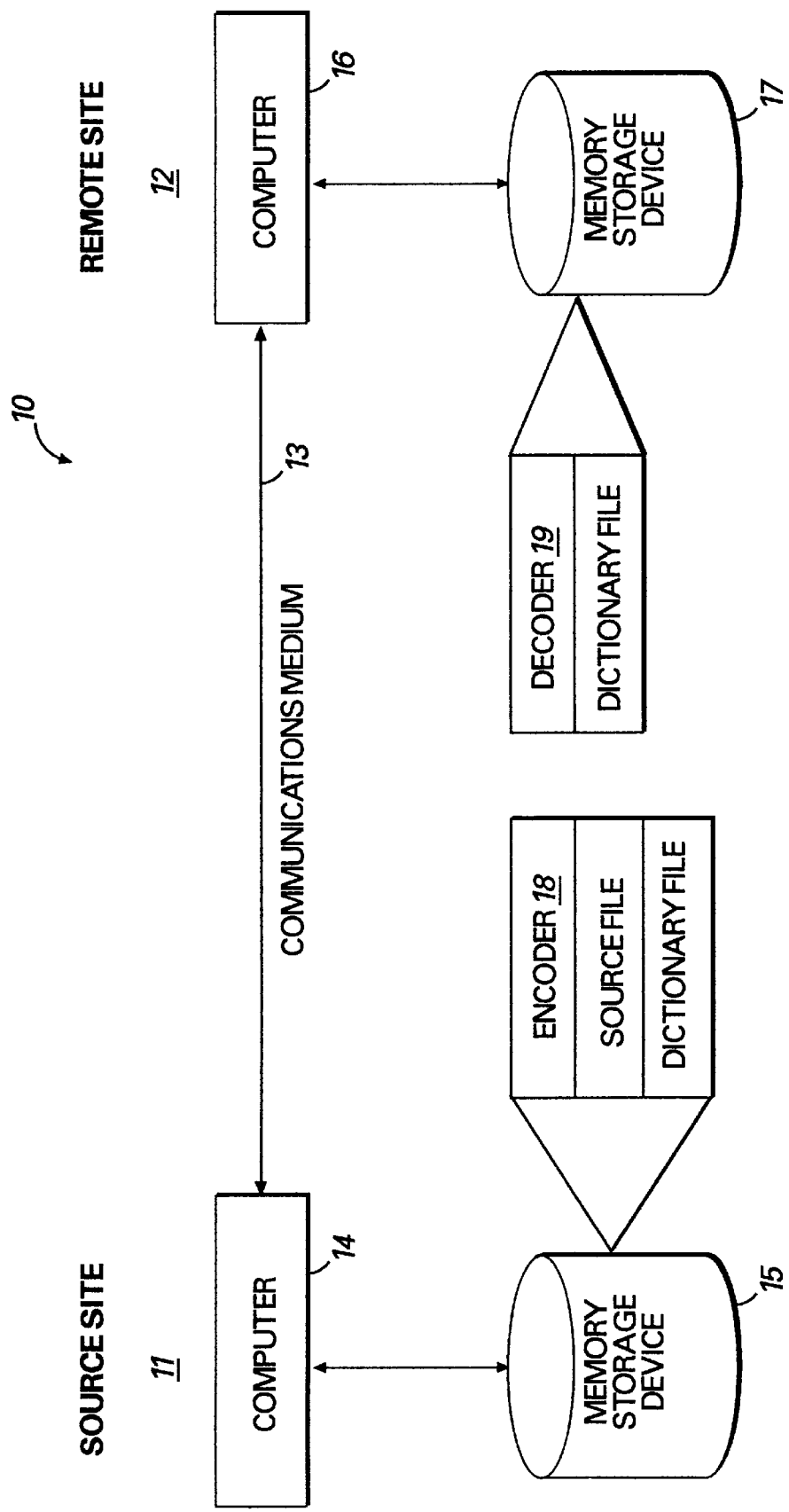
FIG. 1 is a diagram illustrating a typical operating environment for the preferred embodiment of the present invention.

The present invention provides an improved data compression system for efficiently processing a source file based on an index or dictionary file. In this system, performance advantages over the prior art are gained based on redundant nature of the two files, i.e., the identical strings of characters or symbols in both the source file and the dictionary file. The present invention is particularly useful for data compression of a source file representing a revised version of an original file, wherein the original file represents the dictionary file.

Although the preferred embodiment will be generally described in the context of an operating system running on a general purpose personal computer, those skilled in the art will recognize that the present invention also can be implemented in conjunction with other types of program modules for execution on other computers. Accordingly, it will be understood that the terms "computer" and "operating system" generally include all types of computers and the operating systems designed for them.

Turning first to the nomenclature of the specification, the detailed description which follows is represented largely in terms of processes and symbolic representations of operations by conventional computer components, including a central processing unit (CPU), memory storage devices for the CPU, and connected pixel-oriented display devices. These operations include the manipulation of data bits by the CPU and the maintenance of these bits within data structures resident in one or more of the memory storage devices. Such data structures impose a physical organization upon the collection of data bits stored within a memory storage device and represent specific electrical or magnetic elements. These symbolic representations are the means used by those skilled in the art of computer programming and computer construction to most effectively convey teachings and discoveries to others skilled in the art.

For the purposes of this discussion, a process is generally conceived to be a sequence of computer-executed steps leading to a desired result. These steps generally require physical manipulations of physical quantities. Usually, though not necessarily, these quantities take the form of electrical, magnetic, or optical signals capable of being stored, transferred, combined, compared, or otherwise manipulated. It is conventional for those skilled in the art to refer to these signals as bits, bytes, words, values, elements, symbols, characters. terms, numbers, records, files or the like. It should be kept in mind, however, that these and similar terms should be associated with appropriate physical quantities for computer operations, and that these terms are merely conventional labels applied to physical quantities that exist within and during operation of the computer.

It should also be understood that manipulations within the computer are often referred to in terms such as adding, comparing, moving, etc. which are often associated with manual operations performed by a human operator. The operations described herein are machine operations performed in conjunction with a human operator or user that interacts with the computer. The machines used for performing the operation of the present invention include general purpose digital computers or other similar computing devices.

In addition, it should be understood that the programs, processes, methods, etc. described herein are not related or limited to any particular computer or apparatus. Rather, various types of general purpose machines may be used with programs constructed in accordance with the teachings of this specification. Similarly, it may prove advantageous to construct specialized apparatus to perform the methods described herein by way of dedicated computer systems with hard-wired logic or programs stored in nonvolatile memory, such as read only memory.

Referring now the drawings, in which like numerals represent like elements throughout the several figures, the present invention and the preferred operating environment will be described. FIG. 1 is a diagram illustrating a representative example of an application for the preferred embodiment of the present invention. Referring now to FIG. 1, the preferred operating environment 10 represents the transfer of a compressed data file from a source site to a remote site via a communications medium, such as a computer network linking computer systems. To support the exchange of data between a resource site 11 and a remote site 12, a communications medium 13 is connected to these sites. The communications medium 13 is preferably a bidirectional data communications link, such as a wideband or local area network. Although the communications medium 13 is shown as a direct communications link between the sites 11 and 12, it will be appreciated that the communications medium 13 can be implemented by a variety of conventional wired or wireless communications devices, including combinations thereof, to support the exchange of data between the sites.

The source site 11 includes one or more computers 14 connected to the communications medium 13. A memory storage device 15, which is connected to the computer 14, stores an original file and a file to be compressed, the revised version of the original file. The original file, which is also described as the dictionary or index file, represents digital data, such as binary data, stored in a tangible storage medium. Likewise, the revised version of the original file, commonly described as the source file, also represents digital data stored within a tangible medium. The dictionary and source files can be implemented by numerous different types and formats of digital data, including text-based characters, ASCII characters, and application-specific formats. However, the data format for the source file is preferably similar to that of the dictionary file.

For purposes of this specification, a "character" can be viewed as the smallest unit of storage used by a computer-implemented process to create a source file or a dictionary file. The present invention is intended for primary use with binary data and can operate upon source or dictionary files having byte-aligned data, word-aligned data, or bit-aligned data. Consequently, it will be understood that the term "character" is used interchangeably with bytes, bits, and words.

The remote site 12 includes one or more computers 16 connected to the communications medium 13 and to a memory storage device 17. The memory storage device 17, which can be implemented by a variety of conventional storage mechanisms, maintains an identical copy of the dictionary file stored at the source site 11. In particular, the dictionary file maintained by the memory storage device 15 is identical to the dictionary file stored on the memory device 17. It will be understood that the use of a common dictionary file at the source site 11 and the remote site 12 is critical to proper encoding and decoding operations by the data compression system to be described below.

Figure 2:
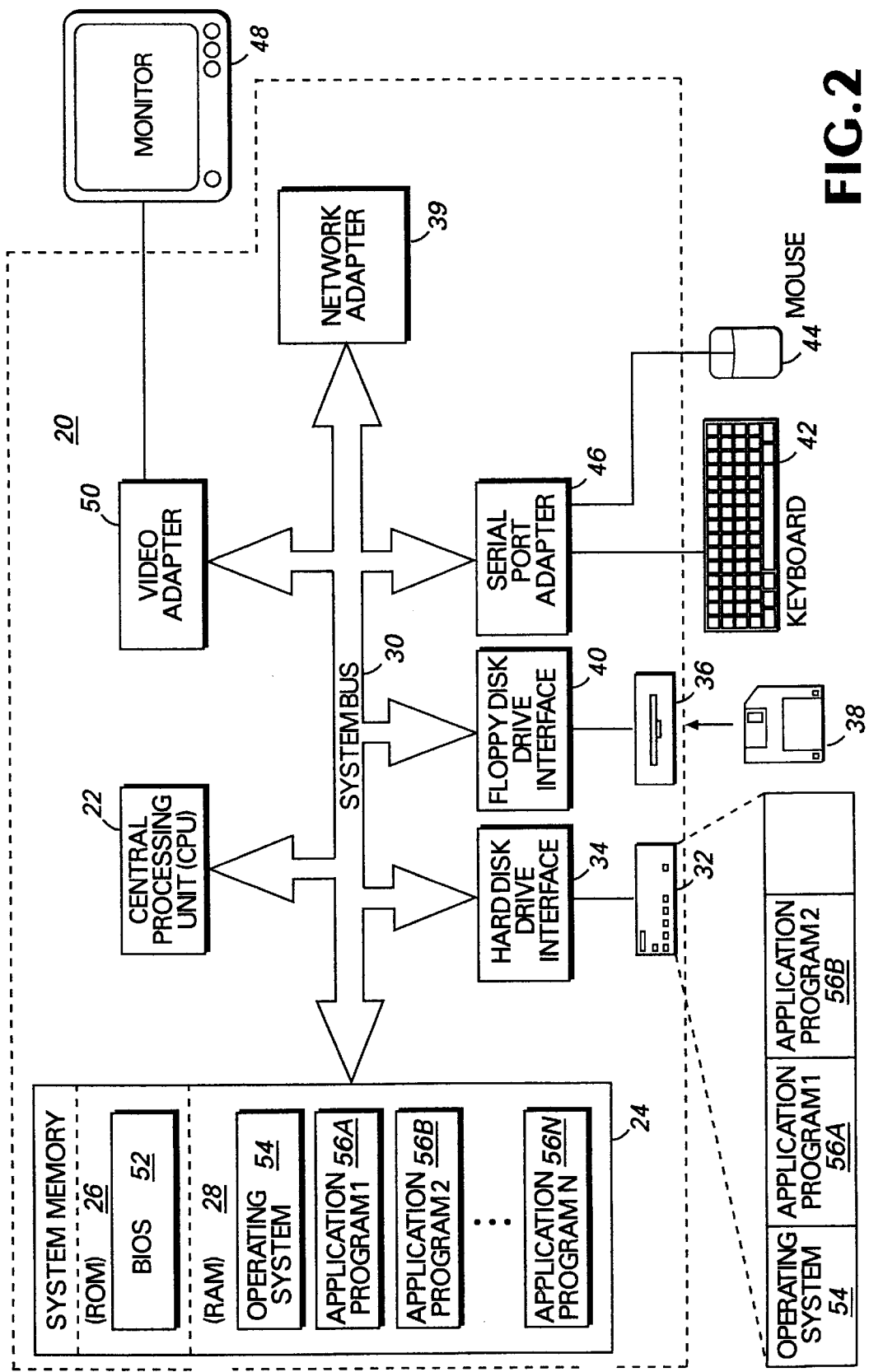
FIG. 2 is a block diagram illustrating the component of a computer system for supporting the operation of the preferred embodiment of the present invention.

FIG. 2 illustrates a conventional personal computer suitable for implementing the computers 14 and 15 at the respective source and remote sites 11 and 12. Those skilled in the art will immediately appreciate that FIG. 2 and the associated discussion are intended to provide a brief, general description of the preferred computer system for supporting the operation of the present invention. Additional information is available in appropriate programming manuals, user's guides, and similar publications.

As shown in FIG. 2, the computers 14 and 15 can be implemented by a personal computer 20, which includes a central processing unit (CPU) 22, such as the 80486 or "PENTIUM" microprocessors manufactured by Intel Corporation of Santa Clara, Calif. The personal computer also includes system memory 24 (including read only memory (ROM) 26 and random access memory (RAM) 28), which is connected to the CPU by the system bus 30. A hard disk drive 32 is connected to the system bus 30 via the hard disk drive interface 34. A floppy disk drive 36, which is used to read or write a floppy disk 38, is connected to the system bus 30 via a floppy disk drive interface 40. A network adapter 39 is connected to the system bus 30 to support network communications operations via a communications link, such as a wired or wireless network (not shown). A keyboard 42 and a mouse 44 are connected to the system bus 30 via a serial port adapter 46. A monitor 48 is connected to the system bus 30 via a video adapter 50.

Although many other internal components of the personal computer 20 are not shown, those of ordinary skill in the art will appreciate that such components and the interconnections between them are well known. Accordingly, additional details concerning the internal construction of the personal computer 20 need not be disclosed in connection with the present invention.

Those skilled in the art will understand that program modules such as the operating system, application programs and data, are provided to the personal computer 20 via one of its memory storage devices, which may include the ROM 26, RAM 28, hard disk drive 32, floppy disk 38, and a CD-ROM (not shown). In the preferred personal computer 20, the hard disk drive 32 is used to store data and program modules, including the operating system and application programs.

When the personal computer 20 is turned on or reset, the Basic Input/Output System (BIOS) 52, which is stored in the ROM 26, instructs the CPU 22 to load the operating system 54 from the hard disk drive 32 into the RAM 28. Once the operating system 54 is loaded into RAM 28, the CPU 22 executes the operating system code and causes the visual elements associated with the user interface of the operating system 54 to be displayed on the monitor 48. When an application program 56a–n is opened by a user, the program code and relevant data are read from the hard drive 32 and stored in the RAM 28.

Referring now to FIG. 1 again, to achieve the desired objectives of conserving memory and efficiently transmitting data, it is useful to compress a data file prior to transmission of this file by the source site 11 to the remote site 12. An encoder 18, also known as a compressor, is used at the source site 11 to compress a data file prior to transmission via the communications medium 13. To decode the compressed file output by the encoder 18, a decoder 19 is used at the remote site 12. The decoder 19, also known as a decompressor, accepts the compressed file and generates a decoded file. The encoder 18 and decoder 19 are preferably implemented as program modules executable on the computers 14 and 16. For example, the encoder 18 can be stored on the memory storage device 15 for use by the computer 14. In similar fashion, the decoder 19 can be maintained on the memory storage device 17 for use by the computer 16. For the representative computer 20 shown in FIG. 2, the encoder 18 and the decoder 19 are program modules that can be stored on the hard disk drive 32 (and eventually loaded into RAM 28 during operation) for convenient access and use of these program modules.

The preferred implementations of the encoder 18 and the decoder 19 are designed to operate as program modules in conjunction with Microsoft™ Corporation's "WINDOWS NT" operating system. However, it should be understood that the invention can readily be implemented in other operating systems, such as Microsoft™ Corporation's "WINDOWS 95" and "WINDOWS 3.1" operating systems, IBM™ Corporation's "OS/2" operating system, and the operating system used in "MACINTOSH" computers manufactured by Apple™ Computer, Inc. Moreover, those skilled in the art will appreciate that the present invention also can be implemented as an application program, such as a "utility" program module. Consequently, it will be understood that the present invention is generally implemented as one or more program modules for operation on a general purpose computer system.

For a typical application, there is a need to transmit the source file from the source site 11 to the remote site 12 in an efficient and timely manner. This could be achieved by compressing the source file prior to transmission and thereafter sending the compressed version of the source file to the desired remote site. The encoder 18 can accept the source file and conduct data compression operations based on use of a separate dictionary to generate a compressed file. Upon receipt of the compressed file, the decoder 19 at the remote site 12 can conduct decoding operations by use of the identical dictionary.

It will be appreciated that the encoding and decoding operations conducted at the respective source and remote sites 11 and 12 are accomplished by the use of a common dictionary or index. For the application shown in FIG. 1, a revised version of an original file is compressed by using the original file as a dictionary at the source site 11. In turn, the encoded file is transmitted via the communications medium 13 to the remote site 12. The revised version of the original file can be recovered at the remote site 12 by decoding the encoded file with the common dictionary, i.e., the original file.

For an alternative application, the data exchange mechanism supported by the communications medium 13 can be replaced by the transfer of the compressed file from the source site 11 to the remote site 12 via a floppy diskette or other forms of removable storage devices. For example, the compressed file can be stored on a diskette at the source site 11. In turn, this diskette can be carried to the remote site 12 and the compressed file subsequently decoded at that site. Regardless of the mechanism used for transferring the compressed file between sites, it will be understood that the dictionary file used for the encoding and decoding operations should be identical at both sites. It will be further understood that the encoder 18 and the decoder 19 can be maintained and used at the same site.

FIG. 3A is a diagram illustrating the principal components of the encoder 18 shown in FIG. 1 and FIG. 3B is a diagram illustrating the principal components of the decoder 19 of FIG. 1. Referring now to FIGS. 1 and 3A, the encoder 18, which is also described as a compressor, comprises a search engine module 62, a matching module 66 and a coding module 68. The search engine module 62 accepts as an input a data file to be compressed, i.e.. the source file. The search engine module 62 also has access to a database associated with a dictionary file to support encoding operations. The dictionary database 64 contains samples collected from the dictionary file. Samples of the dictionary file can be created by sampling this file at predefined intervals. This predefined interval can be viewed as the "stride" for the sampling operation. Each sample preferably has a predetermined fixed sample length. The dictionary database 64 also includes a parameter defining the location of each sample in the dictionary file, i.e., an offset value.

The dictionary database 64 is preferably implemented as an in-storage binary tree and can be stored within a memory storage device. However, those skilled in the art will appreciate that other database mechanisms can be used to store the samples and offset values of the dictionary file, including conventional hash tables.

The source file typically contains one or more sections of characters that are identical to character sections in the dictionary file. Based on this assumption, segments of the source file can be obtained. These segments preferably have a character length defined by the fixed sample length of the samples in the dictionary database 64. The search engine module 62 compares segments of the source file to the dictionary database to locate matches between the associated characters. In response to locating a match, the search engine module 62 outputs the location of the matching characters to the matching module 66. Each match output by the search engine module 62 represents one or more characters of the source file that match character(s) of the dictionary file.

The matching module 66 has access to the dictionary file used to create the dictionary database 64. In response to a match of characters of the source file to any of the stored samples in the dictionary database 64, the matching module 66 locates a matched segment representing the longest contiguous useful match between characters of the source file and the dictionary file. This longest contiguous useful match is preferably located by first scanning backwards and then forwards from the match point within the dictionary file, i.e., the character of the dictionary file representing the start position for the stored sample that matches the source file segment. In response to finding the longest contiguous useful match, the matching module 66 determines the length of this matched segment.

The longest contiguous useful match represents the "useful" section of a match that has not yet been encoded. For example, if the source file contains the phrase "The first man of the moon was Adam" and the dictionary file contains the stored samples "This first man was Adam" and "The man on the moonbeam", then two possible matches are possible: (1) "The_first_man_" and (2) "_man_on_the_moon", wherein the underscore "_" represents a space between characters. These two matches include an overlap section of five characters, namely the term "_man_". Thus, the preferred encoding process produces the longest contiguous useful matches of (1) "The first man" and (2) "on the moon" based on a search for a "useful" section of match that has not yet been encoded.

Although the preferred embodiment of the present invention operates to encode a source file based on locating the longest contiguous useful match between the source file and a common dictionary file, it will be appreciated that the present invention can be generally extended to operation upon other types of matches between the source file and the dictionary file. For example, the present invention also encompasses the encoding of source file based on locating a contiguous match between the source file and the dictionary file. Consequently, it will be understood that the present invention is not limited to the preferred concept of searching for the longest contiguous "useful" match, but also includes the broad concept of searching for a contiguous match between the source and dictionary files.

In addition, the matching module 66 also operates to locate any unmatched segments of the source file by finding any characters positioned between characters of the source file represented by the matched segment and characters of the source file represented by a prior matched segment. In other words, the matching module 66 locates any characters in the source file that have not yet been encoded and are positioned immediately prior to the matched segment. The matched segment and, if available, the unmatched segment are output by the matching module 66 to the coding module 68.

The coding module 68 creates an encoded file in response to the output of the matching module 66. The encoded file contains code groups of matched and unmatched codes. The matched code defines the length of the matched segment and the location in the dictionary file of the start of the matched segment. The unmatched code defines a length of the unmatched segment and the characters of the unmatched segment. To distinguish a matched code from an unmatched code, a match flag can be set in the matched code. In contrast, the match flag can be cleared in the unmatched code. Accordingly, the state of the match flag is useful in determining whether the code is a matched code or an unmatched code.

Although not shown in FIG. 3A, the encoded file can be supplied to a second compressor to further compress the once compressed information of the encoded file. The second compressor can be implemented by a conventional data compression system using the L-Z compression technique, the Huffman compression technique or arithmetic encoding. The Huffman compression technique is further described in an article by D. A. Huffman entitled "A Method for the Construction of Minimum Redundancy Codes", *Proceedings* IRE, 40, 10, pages 1098–1100 (September 1952). Other conventional compression techniques can also be applied to support additional compression passes of the encoded file produced by the first compression pass of the encoder 18.

FIG. 3B shows a decoder, such as the decoder 19, for decoding an encoded file with a dictionary file to generate a source file. Referring now to FIGS. 1 and 3B, the decoder 19 comprises a decision module 63, a decoder module 65, and an output module 67. The decision module 63 accepts as an input the encoded file and thereafter selects one of the codes of the encoded file for processing. The decision module 63 determines whether the selected code is one of three codes, an unmatched code, a matched code, or a stop code indicating the end of the source file. The decoder module 65 responds to a matched code by obtaining the length of the matched segment and the location in the dictionary file of the matched segment. Moreover, the decoder module 65 further responds to an unmatched code by obtaining from the unmatched code the unmatched segment length and the characters of the unmatched segment. The output of the decoder module 65 is supplied to the output module 67. The output module 67, which has access to the contents of the dictionary file, responds to the matched segment length and to the matched segment location by outputting characters in the dictionary file corresponding to the matched segment. The output module 67 is also responsive to the unmatched segment length and the characters of the unmatched segment, and outputs characters of the source file corresponding to the characters of the unmatched segment. The output of the output module 67 forms the decoded file, i.e., the "reconstructed" source file.

FIGS. 4A and 4B, collectively described as FIG. 4, illustrate the preferred structures of data fields for the coded groups output by the compressor. FIG. 4A illustrates the preferred structure of data fields for the matched code, and FIG. 4B illustrates the preferred structure of data fields for the unmatched code. Referring now to FIGS. 1 and 4, a code structure 70 for the matched code comprises three data fields: (1) a match flag 72, (2) a matching segment length 74, and (3) an offset value 76. Each matched code output by the compressor 18 has a format defined by the data structure 70. The match flag 72 is set to a logical high value ("1") to distinguish a matched code from the unmatched code illustrated in FIG. 4B. The matching segment length 74 represents the length of the matched segment, i.e., typically the length of the longest contiguous useful match between characters of the source file and the dictionary file. The offset value 76 represents the location in the dictionary file of the start of the matched segment.

As shown in FIG. 4B, a code structure 80 for the unmatched code also includes three data fields: (1) a match flag 82, (2) an unmatched segment length 84, and (3) a data segment 86. The match flag 82 of the data structure 80 is cleared to distinguish the unmatched code from the matched code. Consequently, it will be appreciated that the state of the match flag in the segments 72 and 82 determines whether the code is either a matched code or an unmatched code. The length segment 84 represents the length of the unmatched segment of the source file, i.e., the characters positioned between the characters of the source file represented by the matched segment and any characters of the source file represented by a prior matched segment. The data segment 86 represents the characters of the unmatched segment of the source file. Thus, the data segment 86 contains characters taken directly from the source file itself.

For the preferred code structures 70 and 80, the match flag segments 72 and 82 are defined by a single bit, the length segments 74 and 84 are defined by 15 bits, and the offset segment 76 is defined by 32 bits. The length of the data field 86 for the unmatched code segment is dependent upon the length of the "raw" data, and can extend up to a maximum length of 32,767 bytes. In the event that the raw data for an unmatched code segment extends beyond this maximum length, then the unmatched segment is encoded as multiple segments. Likewise, if a matching section is longer than 32,767 bytes, then it is encoded as a set of multiple matched codes having matching segment lengths and offset values. For example, a matching segment having a total length of 69,326 bytes is encoded as three matched codes, as follows: (1) a first code group having a match flag, length=32,767, offset value=0; (2) a second code group having a match flag, length=32,767, offset value=32,767; and (3) a third code group having a match flag, length=3792, offset value=65, 534. The preferred code structures 70 and 80 support the compression of source files having a maximum data length of approximately 4 Gigabytes.

It will be understood that a matched code provides the decoder 19 with sufficient information to locate the offset value in the dictionary file and to obtain the specified length of characters from the dictionary file. Likewise, the unmatched code supplies the decoder 19 with sufficient information to output the actual source file data offered by the unmatched code.

FIG. 5A illustrates the preferred format for the encoded file output by the compressor. Referring now to FIGS. 1 and 5A, a file format 90 for the encoded file output by the encoder 18 comprises a header 92 and a corresponding coded file 94. The coded file 94 comprises a sequence of code groups 96. A code group 96 can include one of three different codes, a stop code, a matched code 70, or an unmatched code 80. A stop code, which designates the end of the source file, preferably comprises two bytes, each set to a logical low value ("0"). The matched code, also described as a coded group, preferably comprises 6 bytes, specifically a matched flag set to a logical high value ("1"), a length of the matched segment, and an offset value. The unmatched code 80, also described as a direct group, preferably comprises 2+n bytes comprising a matched flag set to a logical low value ("0"), a length of the unmatched segment, and the "raw" data of characters in the unmatched segment.

Although FIG. 5A shows the coded file 94 containing four code groups, it will be understood that this data content is shown merely as an example to illustrate the data structure of the coded file. The coded file 94 can contain one or more of the code groups 96. Indeed, those skilled in the art will appreciated that the content of the coded file 94 is dependent on the data supplied by the source file and the dictionary file.

FIG. 5B illustrates the preferred format for the header of the encoded file shown in FIG. 5A. Turning now to FIGS. 1 and 5B, the header 92 of the coded file 94 defines predetermined characteristics of the coded file to support the decoding of the sequence of matched and unmatched codes. The header 92 preferably includes the following data fields: source file name 100, source file checksum 101, source file size 102, source file particulars 103, dictionary file name 104, dictionary file checksum 105, dictionary file size 106, and dictionary file particulars 107.

As suggested by their descriptive terms, the source filename and dictionary filename fields 100 and 104, respectively, define the source file that has been encoded and the corresponding dictionary file to be used for the decoding operation. The source file checksum 101 and the source file size field 102 respectively define a checksum of the source file and the length of the source file. The dictionary file checksum field 105 and the dictionary file size field 106 respectively define a checksum of the dictionary file and the size of the dictionary file. The source file checksum field 101 and the source file size field 102, as well as the dictionary file checksum field 105 and the dictionary file size field 106, are useful for verifying a successful decode operation. The source file particulars field 103 and the dictionary file particulars field 107 respectively define certain times of interest for the source and dictionary files, such as creation time, last access time, last modification time, and so forth. Although the timing data of the source file particulars field 103 and the dictionary file particulars field 107 is not critical, it will be appreciated that such information is particularly useful for distinguishing whether file is corrupted or merely altered.

In summary. it will be understood that the source filename field 100 defines the source file that has been encoded at the source site 11 by use of a particular dictionary file. The dictionary filename field 104 names the particular dictionary file to be used to support the decoding of the source file at the remote site 12. The remaining source and dictionary fields within the header 92 are also used at the remote site 12 to support proper decoding of the source file named in the source file name field 100.

Figure 6A:
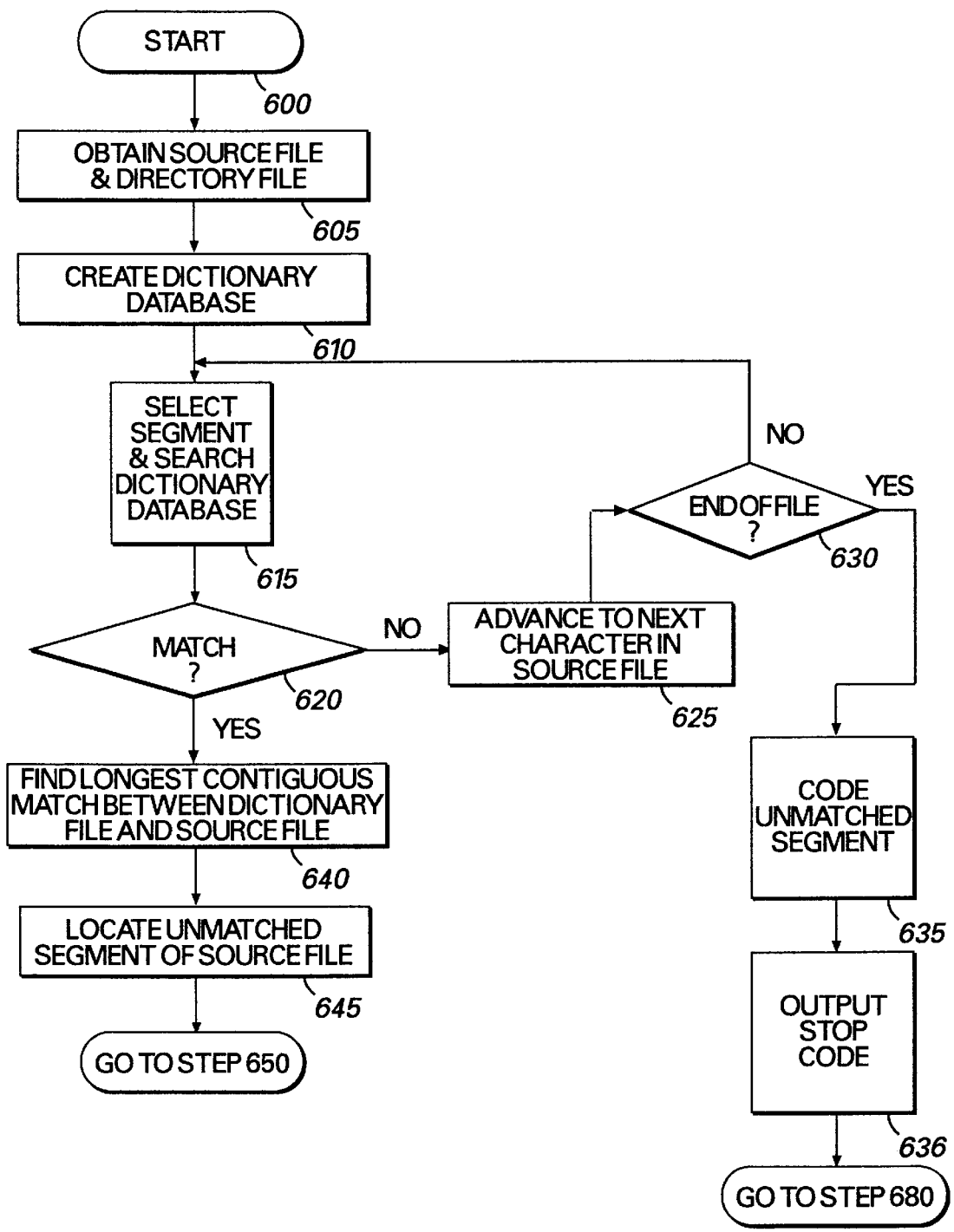
FIGS. 6A and 6B, collectively described as FIG. 6, are logical flow diagrams illustrating the tasks completed by the preferred embodiment of the present invention.
Figure 6B:
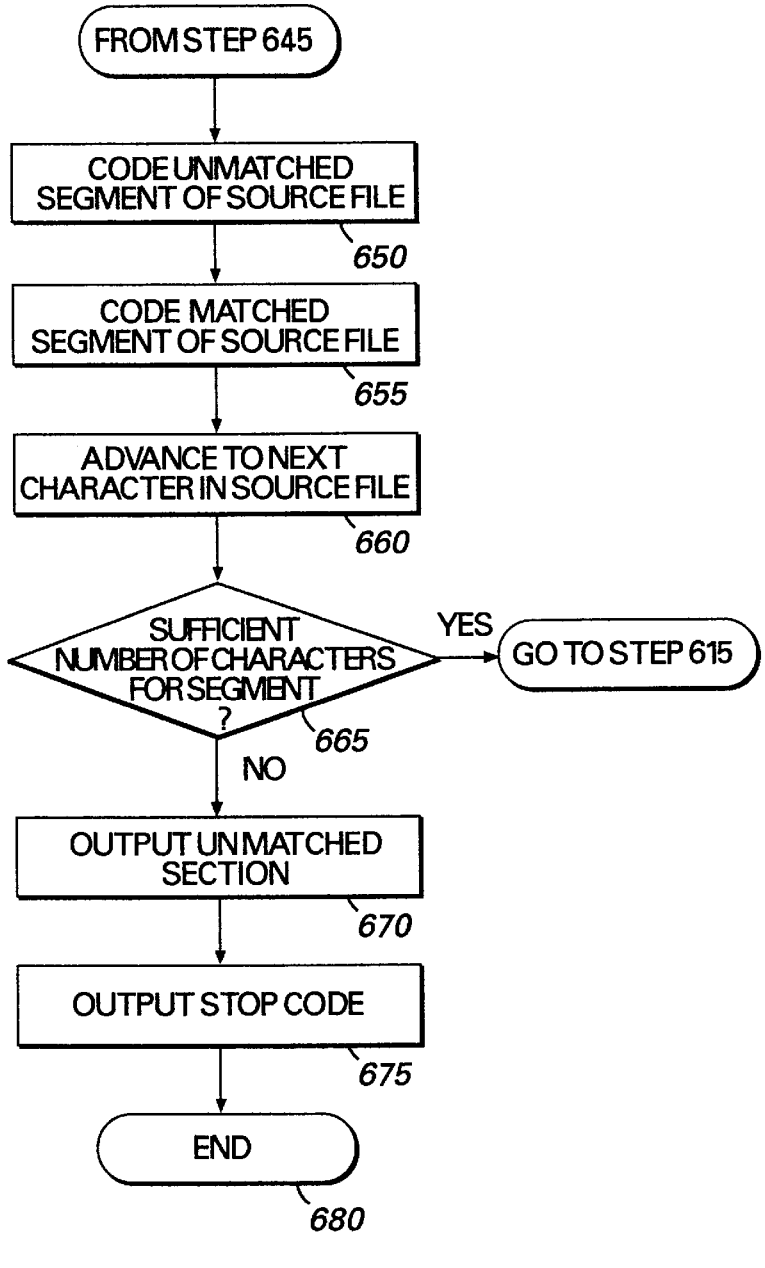

FIGS. 6A and 6B, collectively described as FIG. 6, are logical flow diagrams illustrating the preferred steps for compressing a source file. Referring now to FIGS. 1 and 6, the computer-implemented process begins at the START task of the step 600 and proceeds to step 605 to obtain a file to be compressed, specifically the source file. In addition, a dictionary file is obtained in step 605 to support the compression of the source file. The source and dictionary files are preferably obtained at the source site 11 from the memory storage device 15. For the representative example described by this application, the dictionary file represents an original data file and the source file represents a revised version of the original file. Nevertheless, the present invention is not limited to operation upon similar files, but can be readily extended to operation with any two separate data files. In step 610, the dictionary file obtained in step 605 is used to create a database known as the dictionary database.

Figure 7:
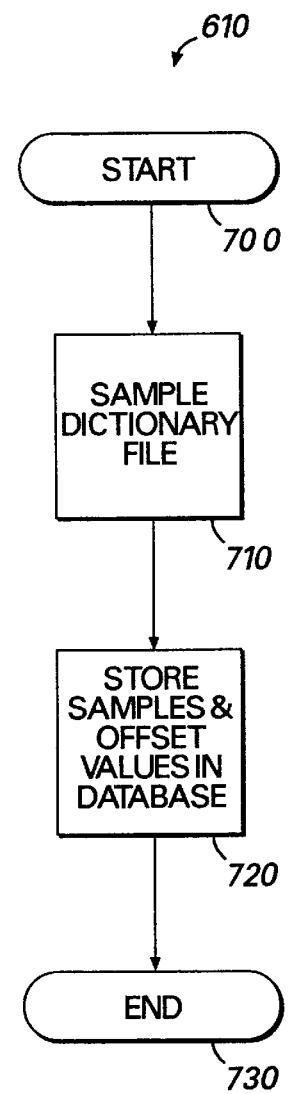
FIG. 7 is logical flow diagram illustrating the preferred steps for the task of creating a dictionary database shown in FIG. 6.

FIG. 7 illustrates the preferred steps for creating a dictionary database. Turning briefly now to FIGS. 1 and 7, the process begins at the START task in step 700 and proceeds to step 710. In step 710, the dictionary file, which contains a set of characters, is sampled at predetermined locations throughout the dictionary file. Each sample has a fixed sample length. In step 720, the samples of the dictionary file are stored in a database to support to subsequent data compression operations. In addition, the start position within the dictionary file for each corresponding sample is stored within this dictionary database during step 720. The process for creating the dictionary database is terminated at the END task of step 730. The dictionary database contains the sampled data taken from the dictionary file and the location or offset value of the samples within the dictionary file. The dictionary database is preferably stored on the memory storage device 15 at the remote site 11.

In general, the dictionary file should be sampled sufficiently often so that all long matches of the source file include a sampled interval of the dictionary file. For example, if the spacing between the predetermined locations for sampling the dictionary file, i.e., the stride, is spaced too far apart, then possible long matches may be missed. The sample length and the stride parameters are useful for tuning the performance of the data compression system of the present invention. Based on empirically derived results, the sample length is set to 8 characters and the stride is set to 18 characters in the preferred embodiment. Compression rates of up to 10:1 have been achieved with this preferred set of parameters. It will be appreciated that reducing the stride will result in a somewhat tighter compression of the data, but at a cost of increased processing time. To obtain maximum compression rate, the stride can be set to the sample length. Alternatively, to obtain the maximum processing rate, the stride should be set to a length longer than that of the sample length.

For the preferred encoding system, only the first occurrence of any given term within a dictionary file is stored as a sample within the dictionary database. Consequently, matches are located by comparing the terms in the source file to samples that represent the first occurrence of the term within the dictionary file. This reduces the number of possible samples within the dictionary database, thereby leading to decreased processing time, but at a cost of a lower compression rate because possible matches are lost. In contrast, if all occurrences of a given sample are stored within the dictionary database, an investigation of all possible matches could be conducted to locate the "best" match. However, the inventor has found that this results in an increased processing time without significant improvement in compression rate performance. If the sampling length is increased to reduce the processing time, then there remains little reason to maintain multiple samples within the dictionary database. By eliminating multiple samples within the dictionary database, processing time can be improved for the encoding operation.

The dictionary database is preferably implemented as a binary search tree to support the acquisition of any particular sample within log 2(n) steps. The dictionary database can be stored by the memory storage device 15 or by any other storage mechanism accessible by the computer 14 at the source site 11. Significantly, the dictionary file that is used to create the dictionary database at the source site 11 is also maintained at the remote site 12 to support decoding operations.

Returning now to FIGS. 1 and 6, the process continues by selecting a segment of the source file in step 615 and comparing the selected source file segment against the stored samples of the dictionary database. Each segment of the source file preferably has a data length defined by the fixed sample length for the samples of the dictionary database. For the initial sequence of steps for this compression process, the first source file segment is preferably selected by starting at the first character of the source file. Consequently, it will be understood that the initial source file segment typically includes the first character of the source file and extends for a fixed sample length of characters for the source file.

In step 620, an inquiry is conducted to determine whether the selected source file segment matches any of the stored samples of the dictionary database. If not, the "NO" branch is followed from step 620 to step 625. In step 625, a new search word formed by advancing to the next character within the source file. An inquiry is then conducted in step 630 to determine whether the end of the source file has been reached. If the advance within the source file has not yet reached the end of the source file, then the "NO" branch is followed from step 630 to step 615.

In contrast, if the end of the source file is located at step 630, then the "YES" branch is followed to step 635. In step 635, any characters located between the previous matched segment and the end of the source file are encoded as an unmatched code and this code group is output to the encoded file. This unmatched code defines (1) a length of these unmatched characters occurring between the end of the file and the previous matched segment (if any), and (2) the characters themselves. As a result of reaching the end of the source file, the process outputs a stop code to the encoded file in step 636 and then terminates at the END task of step 680.

If the response to the inquiry of step 620 indicates that the selected source file segment matches a stored sample of the dictionary database, then the "YES" branch is followed from step 620 to step 640. In step 640, a matched segment representing the longest contiguous useful match between characters of the source file and the dictionary file is located. This search for the longest contiguous useful match begins in the dictionary file at the start position for the stored sample that matches the selected source file segment. In response to locating the matched segment, the length of the characters representing the longest contiguous match is then determined.

The search for the longest contiguous match between the source and dictionary files preferably starts by starting at the start point for the matching sample and scanning backwards through the dictionary file. Upon finding the start position of the dictionary file or a first character of the dictionary file that does not have a similarly positioned, matching character in the source file, then a match failure is noted and a forward scan of the dictionary file is started. The forward scan begins in the dictionary file at the start point for the matching sample and continues until a first character of the dictionary file having no match with the source file is located. It will be understood that this scanning process to find the longest continuous useful match also can be conducted by first scanning the dictionary file in a forward direction and subsequently scanning the rear portion of the dictionary file. However, the preferred scanning process is likely to result in less memory paging. This search actually results in finding the longest contiguous "useful" match because possible matches with characters of a prior matched segment are avoided to prevent duplicative encoding operations.

In step 645, an unmatched segment of the source file, if any, is located based on an examination of the characters positioned between the characters of the source file represented by the matched segment located in step 640 and any characters of the source file represented by a matched segment positioned immediately prior to the present matched segment. Thus, the unmatched segment is defined by the characters positioned between the present matched segment and the previous matched segment. The start position of the unmatched segment is defined by the source file character located immediately after the previous unmatched section. The stop position of the unmatched segment is defined by the source file character located immediately prior to the present matched section.

In step 650, the unmatched segment, if any, is coded to create an unmatched code. The unmatched code defines the character length of the unmatched segment and includes the source file data for this unmatched segment. In addition, the unmatched code includes a flag to designate this code as an unmatched code.

In step 655, the matched segment is coded by creating a matched code. The matched code defines the length of the matched segment and the location in the dictionary file of the start of the matched segment. In addition, the matched code can include a flag that is set to designate this code segment as a matched code. The unmatched code and the matched code are then output as code groups to the encoded file representing the compressed data set, i.e., the output of the compressor.

In step 660, the character in the source file positioned immediately after the matched segment is located to continue the examination of each of the characters of the source file. Upon locating and processing a matched section, the process begins a search for the next matched section, if any, by reading sufficient number of characters from the source file to form a key or segment for comparison to the dictionary database. In step 665, an inquiry is conducted to determine whether a sufficient number of characters are available within the source file to form a search segment prior to reaching the end of the source file. If a sufficient number of characters are not available to form the segment, or if the end of the source file has been reached, then the "NO" branch is followed to step 670. In step 670, the characters located after the most recent matched section, if any, are treated as an unmatched section and coded as an unmatched code. This unmatched code is output to the encoded file. A stop code is then output to the encoded file in step 675 and the process terminates in step 680. However, if the inquiry in step 665 results in a positive response, then the "YES" branch is followed to step 615 to select another source file segment to continue the compression process.

In view of the foregoing, it may be a useful exercise to apply the preferred data compression system to a pair of specific text-based data file shown in Tables 1 and 2. Table 1 describes the text-based characters of the dictionary file, whereas Table 2 describes the text-based characters of the source file. For this illustrative example, the source file represents a revised version of text for the dictionary file.

TABLE 1 this__is__the__old__version__of__the__sentence.

As shown in Table 1, the dictionary file for this example contains 40 text-based characters (including spaces between words). The dictionary database is created by sampling the contents of this dictionary file. For this example, the fixed sample length is set to 4 characters and the stride is set to 12 characters. In other words, the dictionary database is created by taking 4 characters from every 12 characters of the dictionary file and storing the samples within a database, preferably in the format of a binary search tree. Consequently, the terms "this", "old__", "of__t", and "nce." are extracted from the dictionary file and stored in the dictionary database. For purposes of illustration, a space between words or characters is shown as an underscore. Each underscore also represents a character.

TABLE 2

The__new__version__of__the__sentence__is__this.

As shown in Table 2, the characters for the source file include 40 text-based characters forming a revised version of the characters presented by the dictionary file.

Turning now to a representative application of the data compression system, the initial source file segment is selected by choosing a segment beginning at the first character of the source file. This initial source file segment has the same character length as a sample of the dictionary database. Consequently, the 4-character term "The__" is selected as the initial segment of the source file. In turn, this selected source file segment is compared against the stored samples of the dictionary database. A review of the samples maintained in the dictionary database confirms that the term "The__" is not stored in the dictionary database.

A new source file segment is now selected by advancing to the next character in the source file and obtaining the term "he__n". The new term "he__n" is compared to the stored samples of the dictionary database. This comparison results in a failure to obtain a match between this selected source file segment and the samples of the dictionary database. Thus, another selected source file segment is selected by moving to the next character in the source file, thereby obtaining the term "e__ne". A comparison of the term "e__ne" to the dictionary database results in a failure to locate a match. Once again, a new source file segment is selected by moving to the next character in the source file. This continues until the selection of the 4-character term "of__t".

A comparison of the term "of__t" to the samples of the dictionary database results in a match. In response, the dictionary file is examined to locate a matched segment representing the longest contiguous useful match between characters of the source file and the dictionary file. This search for the longest contiguous useful match begins in the dictionary file at the start position for the stored sample that matches the selected source file segment. Based upon this search of the dictionary file, the matched segment is "__version__of__the__sentence". This matched segment comprises 24 characters and starts within the dictionary file at character position 15. The matched segment is located by first scanning backwards through the dictionary file from the start point, and thereafter scanning forwards from this start point, to locate the boundaries of the longest contiguous useful match.

In response to locating the matched segment "__version__of__the__sentence", an examination of the source file is conducted to locate any unmatched segment of characters positioned between the matched segment and the prior matched segment. From this example, the matched segment "__version__of__the__sentence" represents the first matched segment. Accordingly, the unmatched segment includes all characters of the source file occurring prior to this first matched segment, i.e., "The__new".

In turn, the matched and unmatched codes are created in response to the matched and unmatched segments and subsequently output as a coded group to the encoded file. Table 3 describes the matched and unmatched codes output to the encoded file.

TABLE 3

[0, 7, "The_new"]
[1, 24, 15]

Referring to Table 3. the entry [0, 7, "The_new"] represents an unmatched code, as indicated by the "0" value placed within the match flag field. The "7" defines a character length of 7 characters of source file data and the term "The new" represents the actual data acquired from the source file. The following entry [1, 24, 15] represents a matched code, as indicated by the "1" value placed within the match flag field. The "24" defines a character length of 24 characters for the longest contiguous useful match between the source file and the dictionary file. The "15" represents the offset value for finding the start point for this longest contiguous useful match within the dictionary file.

Because the selected source file segment matches a sample of the dictionary database, the next selected source file segment is located by advancing to the character in the source file occurring immediately after the matched segment. Thus, the next selected source file segment is "_is_" which is positioned immediately after the matched segment of "version_of_the_sentence". A comparison of the term "_is_" to the dictionary database does not locate a match of the selected source file segment to the stored samples of the dictionary database. In successive fashion, the terms "is_t", "s_th", and "_thi" are selected as source file segments and compared to the samples of the dictionary database. None of these selected source file segments have a corresponding set of characters in the dictionary database. Indeed, the next term having a match in the dictionary database is the selected source file segment of "this".

Because the dictionary database contains the sample "this", in comparison of the selected source file segment of "this" to the dictionary database results in a match. A matched segment representing the longest contiguous useful match is also "this". This matched segment comprises 4 characters and has a start position or offset within the dictionary file of character position 1.

The unmatched segment is the term "_is_" which is located between the characters of the source file represented by the present matched segment and the characters of the source file represented by the prior matched segment of "_version of the sentence". In turn, the unmatched and matched codes representing the unmatched and matched segments are created. Table 4 describes the unmatched and matched codes added to the coded file.

TABLE 4

[0, 4, "_is_"]
[1, 4, 0]

As shown in Table 4, the matched code for the matched segment "this" is [1, 4, 0] and unmatched code for the unmatched segment of "is" is [0, 4,"_is_"]. The entry [1, 4, 0] represents another matched code, as indicated by the "1" value placed within the match flag field. The "4" defines a character length of 4 characters for the longest contiguous useful match between the source file and the dictionary file. The "0" represents the offset value for finding the start point for this longest contiguous useful match within the dictionary file. The entry [0, 4,"_is_"] represents an unmatched code, as indicated by the "0" value placed within the match flag field. The "4" defines a character length of 4 characters of source file data and the term "_is_" represents the actual data acquired from the source file.

TABLE 5

| Codes | Character Count |
| --- | --- |
| [0, 7, "The_new"] | 9 |
| [1, 24, 15] | 6 |
| [0, 4, "_is_"] | 6 |
| [1, 4, 0] | 6 |
| | 27 |

Table 5 provides a summary of the matched and unmatched codes output by the data compression system to generate a compressed version of a source file comprising "The_new_version_of_the_sentence_is_this." based on a dictionary file of "this_is_the_old_version_of_the_sentence." The set of 40 characters in the source file, which represents a total of 40 bytes without compression, can be compressed to a smaller total of 27 bytes. It will be understood that the numbers in the code groups are not all represented by the same number of bits: the first number (flag) is represented by 1 bit, the second number (location) is represented by 15 bits, and the third number (offset value or data) is represented by 32 bits.

Figure 8:
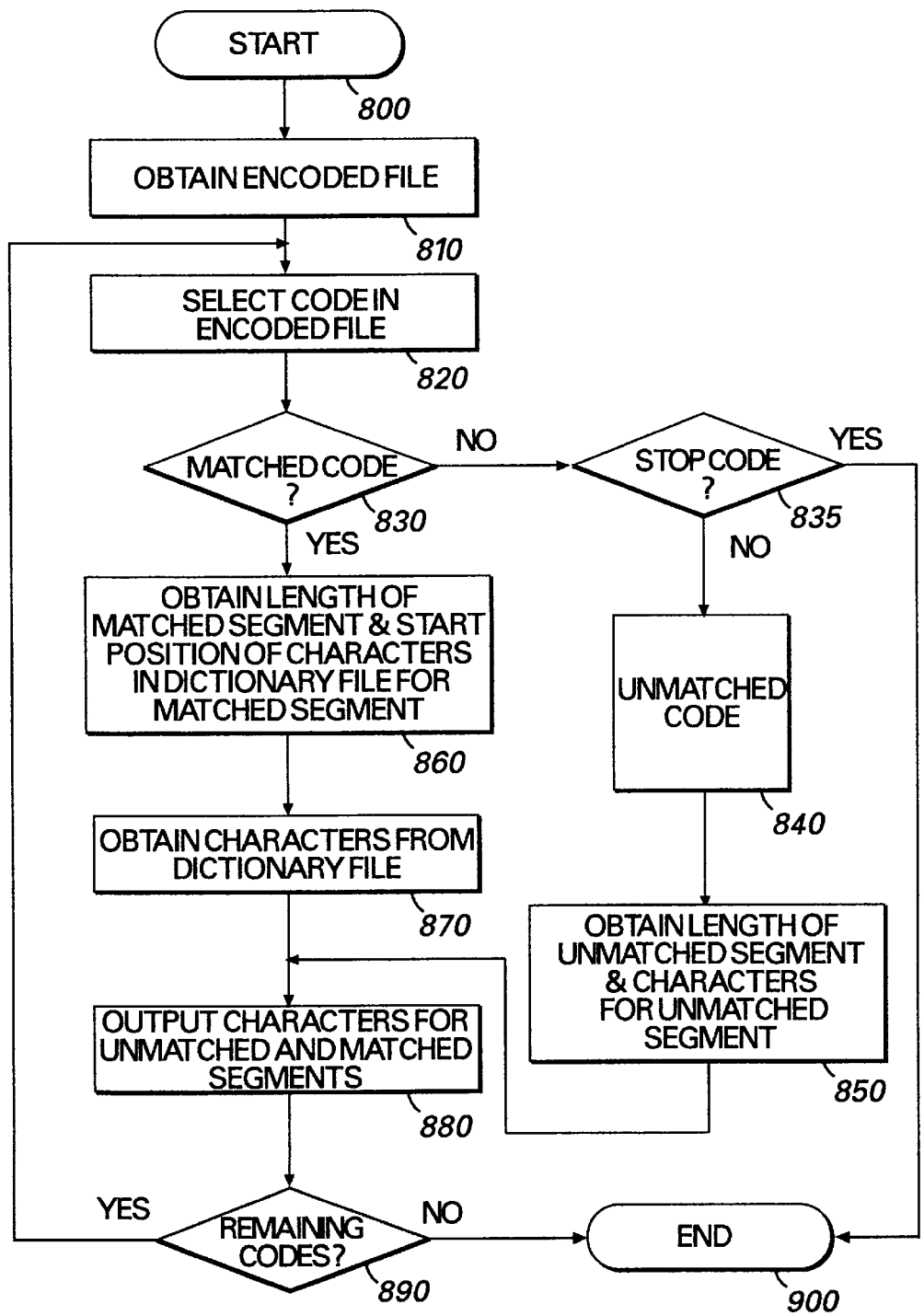
FIG. 8 is logical flow diagram of the preferred steps for decompressing a coded file generated by the preferred embodiment of the present invention.

FIG. 8 is a logical flow diagram illustrating the preferred steps for decoding a compressed data file. Referring now to FIGS. 1 and 8, the computer-implemented process begins at the START task in step 800 and proceeds to step 810 to obtain a compressed data file. This encoded file represents a compressed version of a source file, as generated by the encoder 18. Accordingly, it will be understood that the encoded file was produced by the process described with respect to FIGS. 6 and 7.

In step 820, a code group is selected from the encoded file obtained in step 810 and subsequently examined. This examination is conducted by examining the state of the codes of the coded group to determine whether a particular code represents an unmatched code, a matched code, or a stop code. Specifically, in step 830, an inquiry is conducted to determine whether the selected code represents a matched code. If the match flag has been set in the selected code, then the code represents a matched code. If the response to the inquiry in step 830 is negative, the "NO" branch is followed to step 835 to determine whether the selected code is a stop code. If so, the end of the source file has been reached and the process follows the "YES" branch from step 835 to step 900 and the decoding process terminates because the end of the encoded file has been reached. In contrast, if the selected code is neither a matched code nor a stop code, then the "NO" branch is followed to step 840 because the code group is a unmatched code.

In step 840, an unmatched code is processed to obtain the length of the unmatched segment and the actual character data for this segment. In step 850, the length and character data for the unmatched segment are obtained and used to produce characters representing the unmatched segment. For an unmatched code, the actual character data is used to produce the characters for the unmatched segment. These characters are then supplied to step 880.

In the event that the match flag is set in the particular code, then the code examined in step 830 is a matched code. Consequently, the "YES" branch is followed from step 830 to step 860. In step 860, the length and the offset value supplied by the matched code are obtained from the matched code. In turn, in step 870, the length and the offset value are used to find the character(s) within the dictionary file. In turn, these characters are output to step 880.

In step 880, the characters for the unmatched or matched segments are supplied to a decoded file. This decoded file represents the source file. In turn, an inquiry is conducted in step 890 to determine whether the encoded file contains an another code group. If so, the "YES" branch is followed to step 820 to obtain the next code group. In contrast, if the response to the inquiry in step 880 is negative, then the process terminates in step 900 at the END task.

In this manner, the data of the source file, which had been compressed based on sampled contents of the dictionary file, can be decoded by use of this dictionary file. The key to the decoding process described in FIG. 8 is accessed to the same dictionary file at both the source and remote sites 11 and 12.

It will be appreciated that some sequences of characters appear much more often than others in a data file. For example, UNICODE text which typically employs two bytes per character, the sequences "the_" and "_the" appear often within a data set, wherein the underscore "_" represents a space between characters. Likewise, for binary data, a sequence of all zeros is common. Consequently, one or more identical samples may arise during the creation of the dictionary database. To expedite the searching of a dictionary database, it is preferable to limit the number of times that any given sample can be inserted within the dictionary database. Based on empirical results, the preferred dictionary database maintains a single copy of character strings for a sample rather than multiple copies of the these character strings. By limiting the samples that can be stored within the dictionary database, the processing time for compressing operations is decreased with little impact on the effectiveness of the data compression technique.

From the foregoing description, it will be appreciated that the present invention provides an efficient data compression system for compressing the characters of a first file based on the characters of a second file known as the dictionary file. Although the present invention is preferably used to compress a revised version of an original file by using the original file as the dictionary, it will be appreciated that use of the present invention can be extended to encoding a source file based on any other type of dictionary file. Indeed, the present invention is not limited to any particular type or format of source and dictionary files.

The foregoing method of the present invention may be conveniently implemented in one or more program modules. No particular programming language has been indicated for carrying out the various tasks described above because it is considered that the operations, steps, and procedures described in the specification and illustrated in the accompanying drawings are sufficiently disclosed to permit one of ordinary skill in the art to practice the instant invention. Moreover, in view of the many different types of computers and program modules that can be used to practice the instant invention, it is not practical to provide a representative example of a computer program that would be applicable to these many different systems. Each use of a particular computer would be aware of the language and tools which are more useful for that user's needs and purposes to implement the instant invention.

The present invention has been described in relation to particular embodiments which are intended in all respects to be illustrative rather than restrictive. Those skilled in the art will understand that the principles of the present invention may be applied to, and embodied in, various program modules for execution on different types of computers regardless of the formats used for the coded segments and coded files.

Alternative embodiments will become apparent to those skilled in the art to which the present invention pertains without departing from its spirit and scope. Accordingly, the scope of the present invention is described by the appended claims and supported by the foregoing description.

What is claimed is:

1. A method for compressing a data file of characters using a separate dictionary file, comprising the steps of:

sampling the dictionary file at predetermined locations within the dictionary file, each sample having a fixed sample length;

creating a dictionary database by storing each sample and a start position within the dictionary file of the corresponding sample; and encoding the data file by comparing the data file to the dictionary database, locating any matches that exist between the data file and the stored samples of the dictionary database, and outputting a matched code for each match and unmatched code segments for all remaining portions of the data file.

2. The method as recited in claim 1, further comprising the step of obtaining from the data file segments having the fixed sample length of each sample.

3. The method as recited in claim 2, wherein the comparing step comprises comparing the selected data file segment against the stored samples of the dictionary database.

4. A method for compressing a source file using a separate dictionary file, the dictionary file sampled at predetermined locations to create samples having a fixed sample length, the samples and a start position within the dictionary file of each sample being stored in a dictionary database, comprising the steps of:

selecting a segment of the source file, the selected segment having a length equal to the fixed sample length;

comparing the selected segment to the samples stored in the dictionary database;

if the selected segment matches any of the samples stored in the dictionary database, then identifying a matched segment; and outputting a matched code to an encoded file, the matched code defining a matched segment length and a location in the dictionary file of the start position of the matched segment.

5. The method of claim 4, further comprising:

if the selected segment does not match any of the samples stored in the dictionary database, then identifying an unmatched segment; and outputting an unmatched code to the encoded file, the unmatched code defining an unmatched segment length and characters of the unmatched segment.

6. The method of claim 5, wherein the unmatched segment represents the characters between the characters of the source file represented by the matched segment and any character of the source file represented by a prior matched segment positioned immediately prior to the matched segment.

7. The method of claim 4, wherein the selected segment begins with a first one of the characters of the source file.

8. The method of claim 7, wherein if the selected segment does not match any of the samples stored in the dictionary database, then (a) advancing to a next one of the characters in the source file; and (b) repeating the comparing step for another selected segment.

9. A method for decoding an encoded file using a dictionary file, the encoded file having codes, including matched codes, comprising the steps of:

selecting one of the codes from the encoded file;

determining if the selected code is one of the matched codes, the matched code defining a matched segment length and a location in the dictionary file of the matched segment; and if the selected code is one of the matched codes, then outputting characters of the dictionary file corresponding to the matched segment to a decoded file.

10. The method of claim 9, wherein the codes include unmatched codes, further comprising the steps of:

determining if the code is one of the unmatched codes, the unmatched code defining an unmatched segment length and characters of the unmatched segment;

if the selected code is one of the unmatched codes, then outputting the characters of the unmatched segment to a decoded file.

11. A computer-readable medium having computer-executable instructions for compressing a source file using a dictionary file, the source file having an unrestricted format, comprising the steps of:

sampling a dictionary file at predetermined locations within the dictionary file, each sample having a fixed sample length;

creating a dictionary database by storing each sample and a start position within the dictionary file of the corresponding sample;

obtaining from the source file segments having the fixed sample length of each sample; and encoding the source file by comparing the source file segments to the stored samples of the dictionary database, locating any matches that exist between the source file segments and the stored samples of the dictionary database, and outputting a matched code for each match and unmatched code segments for all remaining portions of the source file.

12. The computer-readable medium as recited in claim 11, wherein the comparing step further comprises:

(a) if the selected source file segment does not match any of the stored samples of the dictionary database, then
    (i) advancing to a next one of the characters in the source file; and
    (ii) repeating the comparing step for another selected source file segment beginning at a next character in the source file;

(b) if the selected source file segment matches any of the stored samples of the dictionary database, then
    (i) beginning in the dictionary file at the start position for the stored sample that matches the selected source file segment, locating a match segment representing the longest contiguous match between the characters of the data file and the dictionary file, and determining the length of the match segment; and
    (ii) locating any unmatched segment of the source file, the unmatched segment representing the characters between the characters of the source file represented by the matched segment and any characters of the source file represented by a prior matched segment positioned immediately prior to the matched segment.

13. The computer-readable medium of claim 12, wherein (1) the unmatched code defines a length of the unmatched segment and the characters of the unmatched segment, and (2) the matched code defines the length of the match segment and the location in the dictionary file of the start of the matched segment.

* * * * *